(12) United States Patent
Koenig et al.

(10) Patent No.: US 9,353,436 B2
(45) Date of Patent: May 31, 2016

(54) COATING APPARATUS WITH ROTATION MODULE

(75) Inventors: Michael Koenig, Frankfurt am Main (DE); Stefan Bangert, Steinau (DE); Uwe Schuessler, Aschaffenburg (DE); Reiner Gertmann, Linsengericht (DE)

(73) Assignee: Applied Materials, Inc., Santa Clara, CA (US)

( * ) Notice: Subject to any disclaimer, the term of this patent is extended or adjusted under 35 U.S.C. 154(b) by 1277 days.

(21) Appl. No.: 12/388,214

(22) Filed: Feb. 18, 2009

(65) Prior Publication Data

US 2009/0226610 A1 Sep. 10, 2009

Related U.S. Application Data

(63) Continuation-in-part of application No. 12/042,869, filed on Mar. 5, 2008, now abandoned.

(30) Foreign Application Priority Data

Mar. 5, 2008 (EP) .................................. 08102305

(51) Int. Cl.
*C23C 14/04* (2006.01)
*C23C 16/04* (2006.01)
*C23C 14/56* (2006.01)
(Continued)

(52) U.S. Cl.
CPC .............. *C23C 14/56* (2013.01); *C23C 14/042* (2013.01); *C23C 14/12* (2013.01); *C23C 14/50* (2013.01); *C23C 14/566* (2013.01);
(Continued)

(58) Field of Classification Search
None
See application file for complete search history.

(56) References Cited

U.S. PATENT DOCUMENTS

| 5,379,984 A | 1/1995 | Coad et al. |
| 5,398,271 A * | 3/1995 | Nishida et al. .................. 378/34 |

(Continued)

FOREIGN PATENT DOCUMENTS

| DE | 10205167 C5 | 1/2007 |
| EP | 0665193 B1 | 9/1998 |

(Continued)

OTHER PUBLICATIONS

EP Search Report mailed Oct. 7, 2008; Application No. 08102305. 3-1215, 6 pages.

(Continued)

*Primary Examiner* — Binu Thomas
(74) *Attorney, Agent, or Firm* — Kilpatrick Townsend & Stockton LLP

(57) ABSTRACT

The present invention refers to a method for coating a substrate, a coating apparatus for carrying out the method and a handling module for coating apparatuses. The handling module comprises a moveable support for a substrate to be coated the support being movable between at least two positions. Further, a mask arranging device for at least one of attaching and detaching a mask to the substrate, and a mask alignment device for aligning the mask with respect to the substrate are provided for, wherein the mask alignment device is attached to the movable support so as to be movable together with the support. Alternatively, the handling module comprises a vacuum chamber, a moveable support for a substrate to be coated, the support being arranged in the vacuum chamber and being rotatable between at least two positions, wherein a mask arranging device for at least one of attaching and detaching a mask to the substrate is arranged within the vacuum chamber of the handling module.

12 Claims, 6 Drawing Sheets

Figure 1:
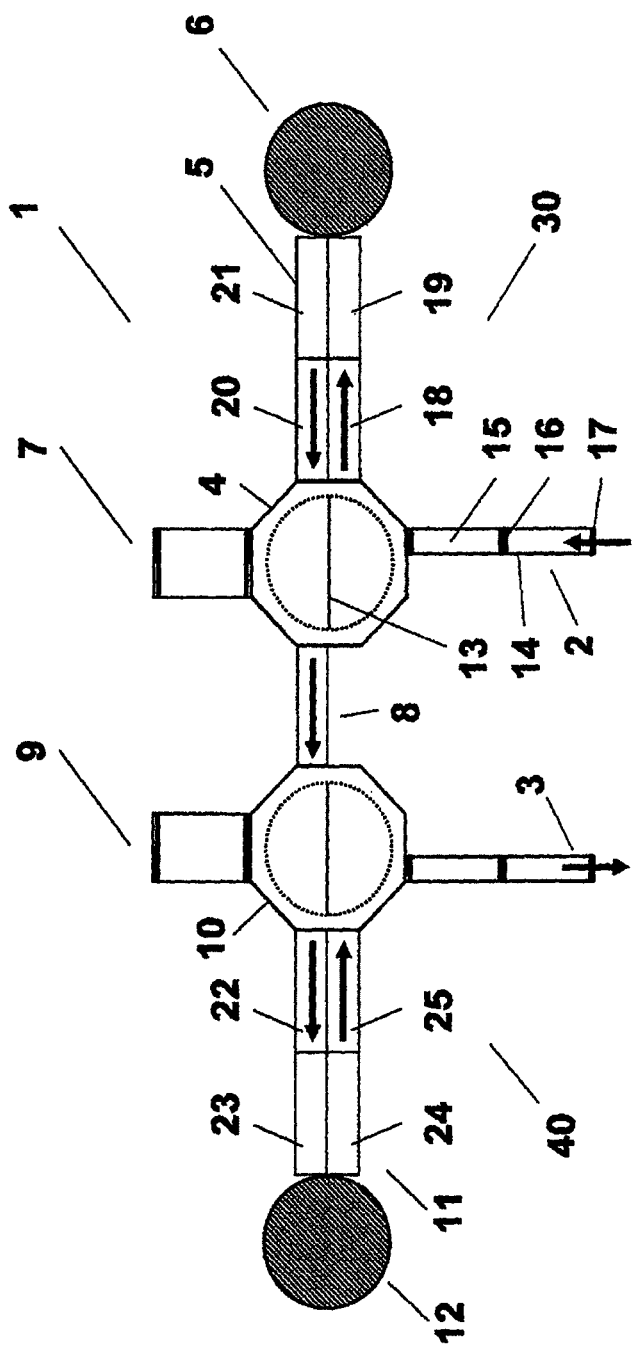

(51) Int. Cl.
   *C23C 16/54*   (2006.01)
   *C23C 14/50*   (2006.01)
   *C23C 14/12*   (2006.01)
   *H01L 21/67*   (2006.01)

(52) U.S. Cl.
   CPC .............. *C23C 14/568* (2013.01); *C23C 16/54* (2013.01); *H01L 21/67155* (2013.01)

(56) References Cited

U.S. PATENT DOCUMENTS

| | | | |
|---|---|---|---|
| 5,738,767 A | 4/1998 | Coad et al. | |
| 6,090,444 A * | 7/2000 | Wixon et al. | 118/721 |
| 6,211,945 B1 * | 4/2001 | Baxter et al. | 355/53 |
| 6,827,788 B2 * | 12/2004 | Takahashi | 118/719 |
| 7,429,300 B2 * | 9/2008 | Kido et al. | 118/719 |
| 2002/0187265 A1 * | 12/2002 | Mori et al. | 118/715 |
| 2006/0150910 A1 * | 7/2006 | Han et al. | 118/721 |
| 2007/0009652 A1 * | 1/2007 | Manz et al. | 118/721 |

FOREIGN PATENT DOCUMENTS

| | | | |
|---|---|---|---|
| EP | 1717339 A | | 11/2006 |
| JP | 2003149791 A | | 5/2003 |
| JP | 2004079349 A | * | 3/2004 |
| WO | 2007/038427 A2 | | 4/2007 |

OTHER PUBLICATIONS

PCT International Search Report mailed May 6, 2009; International Application No. PCT/EP2009/051898, 10 pages.

* cited by examiner

COATING APPARATUS WITH ROTATION MODULE

PRIORITY

This application claims priority under 35 U.S.C. §119(a) to EP 08102305.3, filed Mar. 5, 2008 and claims the benefit of the filing date of U.S. patent application Ser. No. 12/042,869 filed Mar. 5, 2008 under 35 U.S.C. §120 as a continuation-in-part application. The entire disclosures of both these applications are incorporated herein by reference for all purposes.

BACKGROUND OF THE INVENTION

1. Field of the Invention

The present invention refers to a handling module for a coating apparatus as well as a coating apparatus for depositing at least one, preferably two or more layers on a substrate and a method for coating a substrate in such a coating apparatus.

2. Prior Art

In modern technology and industry coating processes are very important, since a lot of products comprise coatings or layers which have to be applied on the products or substrates. For example, displays for television apparatuses or computer monitors may comprise a plurality of layers which have to be applied on a glass substrate. This is especially true for so-called OLED-displays, monitors or television screens, which comprise organic light emitting diodes. These organic light emitting diodes are composed of a plurality of layers which are deposited one after the other. In order to have separate pixels which can be activated independently, layers have to be structured or patterned. In order to achieve a structure or pattern, masks are used during the coating process. Accordingly, different masks for different layers have to be used and during the production process the masks have to be arranged and removed from the substrate for several times.

Another application for organic light emitting diodes is their use in lighting devices. The fabrication is less complex compared to display technology, since the different RGB (Red Green Blue)—layers do not have to be offset to each other. Nevertheless, several thin layers have to be deposited.

EP 17 173 39 A2 discloses a continuously working in-line coating apparatus in which a substrate to be coated is travelling along a coating path, the substrate being coated with different layers or treated by corresponding pre- or after-treatments. Along the coating path having a transport path for the substrates included therein rotation modules are provided for, which allow to transfer the substrate to a mask-exchange station and to transport back the masks to the beginning of a specific coating section so as to be re-used for a new substrate. Due to the in-line design of such an apparatus, a very effective coating of the substrates can be achieved. However, such an apparatus requires lot of space for the coating path and the transport paths of the masks.

Another apparatus for manufacturing an organic electroluminescence display is disclosed in US 2002/0187265 A1. According to this concept, a lot of coating sections for depositing single layers are disposed one after the other, while each of the coating sections comprise one central handling chamber with a transfer robot and adjacent coating and treatment chambers around the handling chamber. Such a design may save some space and therefore the space requirements are reduced, however, due to separate chambers for preparing the substrate before coating, still huge space is required for such an apparatus. Moreover, a great number of transfer steps by the transfer robot with respect to the surrounding treatment and coating chambers make such a coating apparatus not very effective for mass production.

A mixed concept for a continuous and discontinuous transport through an in-line coating apparatus is disclosed in DE 102 05 167 C5. According to this concept, a rotation module is disposed at the end of a continuously working conveyor transporting the substrates through vacuum coating chambers. Since the rotation module comprises several retainers for receiving substrates, the rotation module may act as a buffer chamber for disrupting continuous transport. However, additional buffer chambers can lead to even more required space.

WO 2007/038427 A2 discloses a method and an apparatus for electronic device manufacture using shadow masks with a continuous in-line design. According to this apparatus, a plurality of deposition vessels are arranged one after the other and every deposition vessel has at least two shadow masks associated therewith. The two masks can be alternately positioned for patterning the deposition material during deposition and for cleaning in adjacent cleaning vessels. Thus, throughput can be increased, but the required space is also increased.

DISCLOSURE OF THE INVENTION

Object of the Invention

Although the methods and apparatuses known from prior art provide good results with respect to the deposition of multi-layer coatings and especially OLED devices, there is still the need for optimizing such apparatuses and the corresponding coating methods with respect to efficiency and necessary effort, especially in terms of space requirements. In addition, these objects should be achieved while simultaneously maintaining a high quality deposition. Further, the apparatus should be usable for different coatings and layer stacks and should therefore provide flexibility with respect to the kind of utilization. Accordingly, it is an object of the present invention to provide an apparatus as well as a method for coating a substrate which enables an improvement with respect to all of these objects.

Technical Solution

The present invention is based on the finding that a handling module for transferring a substrate from one part of a coating apparatus to another part allows for very effective and space-saving design of the coating apparatus, if a mask arranging and/or mask alignment device is included in the handling module. Due to the integration of the mask arranging and/or mask alignment in the handling module, the efficiency can also be increased, since it is not necessary to transfer the substrate to a specific mask arrangement and/or alignment station. Thus, according to the present invention the integration of the mask arrangement and/or alignment station(s) allows to carry out the mask arrangement and/or alignment processes at positions of the substrate which the substrate takes during normal processing in the handling module. Accordingly, no additional positions for mask arrangement and/or mask alignment have to be run into. Thus, additional components like mask arrangement or mask alignment chambers are no longer necessary. Further, additional transport steps for the substrate may be avoided. As a consequence effectivity is increased and space requirements are decreased. In addition, the integration of mask arrangement and/or alignment into the handling module also enables the provision of a plurality of independently working coating areas or coating sections so that the flexibility of the apparatus is enhanced and the processes in the coating areas or sections can be optimized independently. Moreover, design of the whole coating apparatus becomes more flexible.

Thus, according to a first aspect of the present invention a handling module for a coating apparatus comprises a movable support for a substrate to be coated. The movable support is movable between at least two positions so that the handling module can transfer the substrate from one part of the coating apparatus to another, and/or exchange components, like masks, for the subsequent coating process. Furthermore, the handling module comprises a mask arranging device for attaching and/or detaching a mask to and/or from the substrate as well as a mask alignment device for aligning the mask with respect to the substrate. For an efficient alignment of the mask with high quality, the invention suggests to attach the mask alignment device at the movable support of the handling module so as to be movable together with the support. While it is advantageous to have the mask arrangement device and the mask alignment device integrated in one mask manipulating device, this aspect of the invention also covers embodiments where the mask arrangement device is separate from the mask alignment device.

The handling module according to the first aspect of the invention may be used in a vacuum coating apparatus. Accordingly, the handling module may comprise a vacuum chamber.

Especially for vacuum coating apparatuses it is necessary to realize a space-saving design. Accordingly, the movable support may be a rotation type support which is rotatable around a rotation axis, since such a design is very space-saving.

As mentioned above, the mask arrangement device and the mask alignment device may be integrated into one mask manipulating apparatus, but may also be separated into two single devices. In the latter case, it is advantageous to at least include the mask arrangement device into the central vacuum chamber of the handling module, which also encompasses the movable support, to enable direct access to the movable support and thus to the substrate without the need of additional chambers for mask arrangement and of additional transport of the substrate.

Such a rotation type handling module may comprise a vacuum chamber, the chamber walls of which are all facing the rotation axis of the movable support, while the form may be different and can be chosen according to the requirements in a rectangular, square, pentagonal, hexagonal or octagonal cross section in a plane transverse the rotation axis. Accordingly, the expression "within the vacuum chamber" is to be understood in a way that the space between the surrounding chamber walls and the rotation axis of the movable support is meant, so that a direct access to the movable support may be achieved.

According to a second aspect of the present invention, for which protection is sought independently and in combination with other aspects of the invention, the handling module is especially designed to be part of a vacuum coating apparatus.

Accordingly, the handling module comprises a vacuum chamber so that a substrate can be transferred or handled under vacuum conditions. Further, the handling module according to the second aspect of the invention comprises also a movable support for a substrate to be coated. The movable support is rotatable around a rotation axis, so that at least two positions can be set to transfer the substrate from one part of the coating apparatus to another part of the coating apparatus and/or to exchange components, like masks. Such a vacuum rotation module is moreover designed such that at least one mask arranging device for attaching and/or detaching a mask to and/or from a substrate is arranged within the vacuum chamber of the handling module. Thus, the efficiency and flexibility of a coating apparatus having such a handling module as well as the quality of the coating deposited by such an apparatus can be increased, since the different coating sections are separated by the handling modules and do not affect each other.

Similar to the invention according to the first aspect, the mask arrangement device and/or the mask alignment device may be attached to the movable support so as to be moved together with the movable support. Such a design allows including of the mask arrangement device and/or of the mask alignment device in the inner space of the vacuum chamber without being in contact with the surrounding chamber walls. Accordingly, neither mask arrangement processes nor mask alignment processes are influenced by position deviations of the vacuum chamber walls due to pressure differences between inside and outside of the vacuum chamber.

The movable support may comprise at least two retainers for receiving a substrate, so that it is possible to carry more than one substrate at the same time. Accordingly, three, four, five retainers or any integer number of retainers are conceivable. Thus, the efficiency may further be increased.

Since the movable support may be a rotatable support, where the substrates are supported with their main surfaces being parallel to the rotation axis, a design for the movable support may be chosen in which the retainers are disposed such that the main or biggest side of the retainers is parallel to the rotation axis of the movable support. The at least two retainers or pairs of retainers may be arranged with their backsides to each other and the rotation axis may be located between the two retainers.

As mentioned above, the number of retainers is not restricted to two. More retainers, namely three retainers, four retainers or even more retainers are conceivable. The retainers may be arranged at the main surfaces of a cuboid or any hexagon or octagon, or similar body and the rotation axis may be the central longitudinal axis of such a body.

The retainers of the support may receive the substrates directly or via substrate carriers on which the substrates are located during movement through the coating apparatus.

Preferably, the substrates are coated with a vertical position of the surface to be coated. Deviations to the vertical direction may be within an angle of ±40°, preferably ±20° to the vertical direction.

If the mask arrangement device and/or the mask alignment device are not attached at the movable support, they may be located within the vacuum chamber of the handling module, especially the central vacuum chamber at at least one position opposite to a retainer in at least one of the positions of the movable support. This means that the position of the mask arrangement device and/or mask alignment device is adapted to a position of the movable support directly in the inner core space of the handling module where the movable support is located.

The mask arranging device and the mask alignment device may be realized by a single mask manipulating apparatus. Thus, the movement of the substrate and/or the mask for approaching the mask and the substrate as well as the movement of substrate and/or mask for aligning substrate and mask can be performed by a single device so that the effort for separate devices can be saved. Although it is conceivable to only move the substrate or the substrate and the mask simultaneously for arranging and aligning of the mask at the substrate, it may be advantageous to only move the mask for such purposes. Accordingly, the mask manipulating apparatus, or if separated devices are used, the mask arranging device and/or mask alignment device may be arranged opposite to a retainer for the substrate at the movable support for the substrates. In combination with a rotatable support with a rotation axis located centrally within the handling module, a very advantageous design is achieved. Since the mask manipulating apparatus or the single mask arranging devices and/or mask alignment devices may be moved together with the substrate support, a fixed relationship between these devices may be achieved so that additional effort for aligning the substrate support and the mask manipulating device can be omitted. Further, the mask arranging and/or mask alignment device is not influenced by the difference between the vacuum conditions inside the handling module and the atmosphere conditions outside the handling module, since the mask arranging and/or aligning device is completely received in the handling module without any contact to the housing of the handling module except via the rotation axis.

The movable support for the substrates may comprise a frame having a plate-, cuboid- or prism-like form, the rotation axis extending along the central longitudinal axis of the plate-, cuboid- or prism-like frame and the retainers being disposed at the sidewalls parallel to the longitudinal axis of the frame. In order to dispose the mask arranging device and/or mask alignment device (mask manipulating device) a holder having a U-bent or U-shaped construction extends from the top area of the frame to a bottom area of the frame so that a space is defined between the substrate retainers and the U-bent or U-shaped holder for the mask manipulating device.

Although every suitable device for arranging and/or aligning a mask at the substrate as well as removing the mask from the substrate may be used, a six axes parallel kinematic may be disposed as a mask manipulating device. Such a six axes parallel kinematic comprises a mounting base and struts or legs which connect the mounting base with a movable platform. Usually six legs or struts are disposed which can be elongated and activated independently. Due to the articulated connection between the legs and the movable platform on the one side and the mounting base on the other side, especially by gimbal connections, the movable platform can be moved and aligned in six independent degrees of freedom of motion.

The movable support of the handling module may have at least two positions into which the movable support can be moved. At least three openings in the housing of the handling module may be assigned to these two positions so that the substrates and the masks can be exchanged with adjacent components of the coating apparatus, like the mask magazine or the coating path for the substrate. However, it is possible that the movable support may be brought in more than two positions and the handling module may have an appropriate number of chamber walls or sidewalls and openings for the exchange with adjacent devices. Accordingly, a movable support may be rotated by 30°, 45°, 60°, 90°, 120° and multiple thereof and the cross-sectional shape of the vacuum chamber may be rectangular, pentagonal, hexagonal, octagonal etc.

The devices which may be connected to the module may comprise buffer chambers, mask storage magazines, transport chambers, load lock chambers, treatment chambers, coating chambers and similar.

A transport chamber is defined as a chamber where only the transport of the substrate is carried out, while treatment or coating chambers are characterized by the fact that additional to a transport or exclusively treatments, like pre-treatments or after-treatments of the substrate, as well as coating processes are carried out.

A coating apparatus for depositing at least one, preferably two or more layers on a substrate may be designed such that at least one, preferably two deposition areas are provided for. Each deposition area is equipped to perform at least a complete deposition of one layer. The expression "layer" may include for the purpose of this application partial layers of a layer stack having the same or different compositions as well as non-continuous layers, especially patterned layers. At the inlet and the outlet of the deposition area, a rotation-type handling module as described above is arranged according to the present invention. The inlet and outlet for loading and unloading the substrates into the coating apparatus may be separately arranged at different or the same rotation-type handling module or may be integrated into one loading and unloading device.

Due to the connection of the coating areas by the handling modules of the present invention, the deposition areas can be efficiently and independently operated. Only the transfer from one deposition area to the other deposition area has to be adapted by adjusting the work cycle of the rotation or handling modules.

The deposition areas may comprise different devices or apparatuses for depositing layers like continuous coating paths or coating chambers for static and/or wobble deposition. Any suitable device or apparatus for depositing a coating layer may be connected to the rotation type handling module.

For establishing a continuous coating path a plurality of twin-type coating chambers each having two compartments back to back adjacent to each other may be provided for. Twin-type coating chambers allow for continuous transport of the substrate in one compartment in one direction and in the adjacent compartment in the opposite direction so that a space-saving design for a continuous coating path is achieved. In order to realize a change of the movement direction a rotation unit for a U-turn of the substrate is provided at one end of the coating path opposite to the handling or rotation module. However, this rotation unit does not need to have mask arrangement and/or mask alignment devices.

Instead of a continuous coating path comprising a rotation unit for changing the movement direction of the substrate, a back-and-forth continuous coating path may be established, in which the substrate to be coated is moved on the same transport path in opposite directions. Accordingly, such a back-and-forth continuous coating path may be realised in a single type coating chamber, since no additional space for the back transport of the substrate has to be provided for. However, two back-and-forth continuous coating paths may be arranged side to side in twin-type coating chambers using separately the two independent coating paths provided by the twin-type coating chamber for the back-and-forth movement of the substrate.

A handling module, a coating area and a mask magazine connected to the handling module may build a coating section. Several coating sections may be disposed one after the other in a coating apparatus for producing a coating with a plurality of layers. The coating sections may be connected to each other via the handling modules. For this purpose, buffer chambers and/or transport chambers may be disposed between adjacent handling or rotation modules. However, the handling or rotation modules may also be connected directly to each other.

In addition, the first rotation type handling module or the first coating section of a coating apparatus may comprise substrate loading sections for introducing the substrate into the vacuum coating apparatus, while the last rotation module or the last coating section of a coating apparatus may comprise a substrate unloading section.

By using the inventive rotation type handling module several advantageous designs of coating apparatuses may be realised. In addition to the type of coating apparatuses having a plurality of coating sections, each being built by a handling module, a coating area and a mask magazine other types using only one rotation type handling module may be implemented. For such a coating apparatus a single mask storage unit being connected to the rotation type handling module may be used for storing and providing of different masks for the coating areas connected to the single rotation type handling module. Thus, a plurality of mask storage units may be omitted.

Similar to the previously described coating apparatus having several rotation type handling modules different types of coating areas may be used together with the single rotation type handling module. Since no further rotation type handling module for mask arrangement and/or mask alignment is available in the coating area, only such coating areas may be used which do not need mask change within the deposition process carried out in the respective coating area.

Accordingly, continuous coating path with a back-and-forth movement of the substrate at the same transport path being realised in a single type or twin type vacuum chamber may be used. Moreover, a continuous coating path using a twin type vacuum chamber with separated movement path for the opposite movement directions may be used, if a rotation unit for turning the movement direction of the substrates is provided for.

In addition to a single, central mask storage unit for storing different types of masks used in the coating apparatus with a single rotation type handling unit and in addition to the at least two or preferably several deposition areas, at least one central loading and/or unloading section for the substrates is provided at the rotation type handling module. The substrate loading section and the substrate unloading section may be separate or combined in one device. Especially, the substrate loading and unloading section may load and unload the substrates at the same transport path. In order to increase the through-put two or more loading and unloading sections may be connected to the rotation type handling module.

The operation of a coating apparatus using a rotation type handling module according to the present invention is especially characterized by the arranging and/or aligning of the mask at the substrate within the rotation type handling module. Due to the design of the coating apparatuses with such a rotation type handling module, the substrates are running through the rotation type module at the beginning and at the end of the coating process carried out in the deposition areas of the apparatus. However, in some cases where no mask is necessary during the coating process, the coating apparatus may comprise additional sections where no rotation type handling module is present. However, for apparatuses having a design with a single rotation type handling module the substrates have to run through the rotation type handling module as the central transportation means, even if a deposition area is present in which no mask is necessary.

According to the design of the inventive coating apparatuses a mask may be attached to the substrate and removed from the substrate in the same rotation type handling module. Accordingly, the handling of the masks is easy. For the design with a single rotation type handling module only a single central mask storage unit may be used so that all masks for all deposition processes carried out in the coating apparatus are changed in the central rotation type handling unit.

As already described above, the rotation type handling module allows separating of different deposition areas so that no deposition process or coating process and no pre-treatment or any after-treatment of the substrate is preferably carried out in the handling module in order to maintain such separation which is beneficial to coating quality.

The components, devices, apparatuses and methods described above may be used for depositing any layer for which a mask is used, especially patterned layers, solar cell structures, OLED (organic light emitting diodes) structures, OLED displays, OLED lighting devices, thin film batteries etc.

SHORT DESCRIPTION OF THE FIGURES

Figure 2:
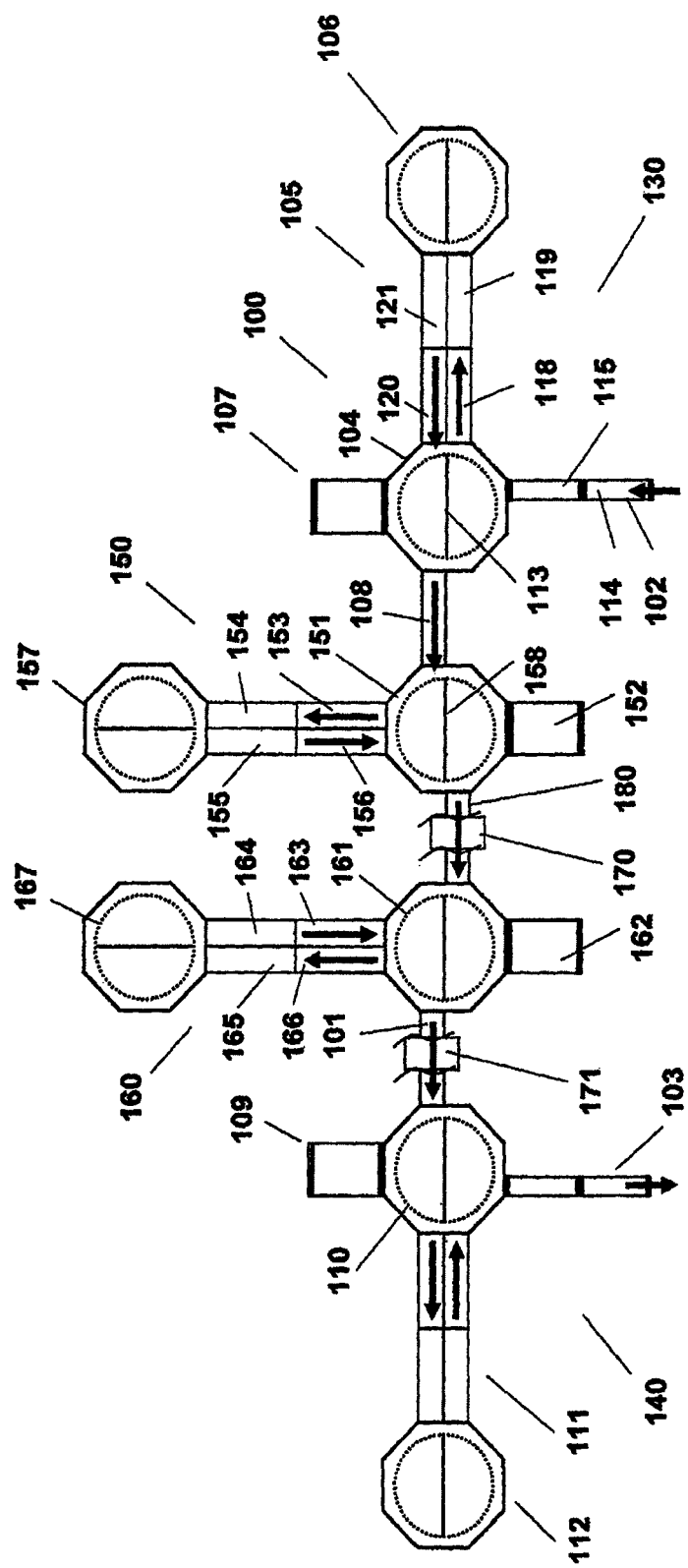
Figure 3:
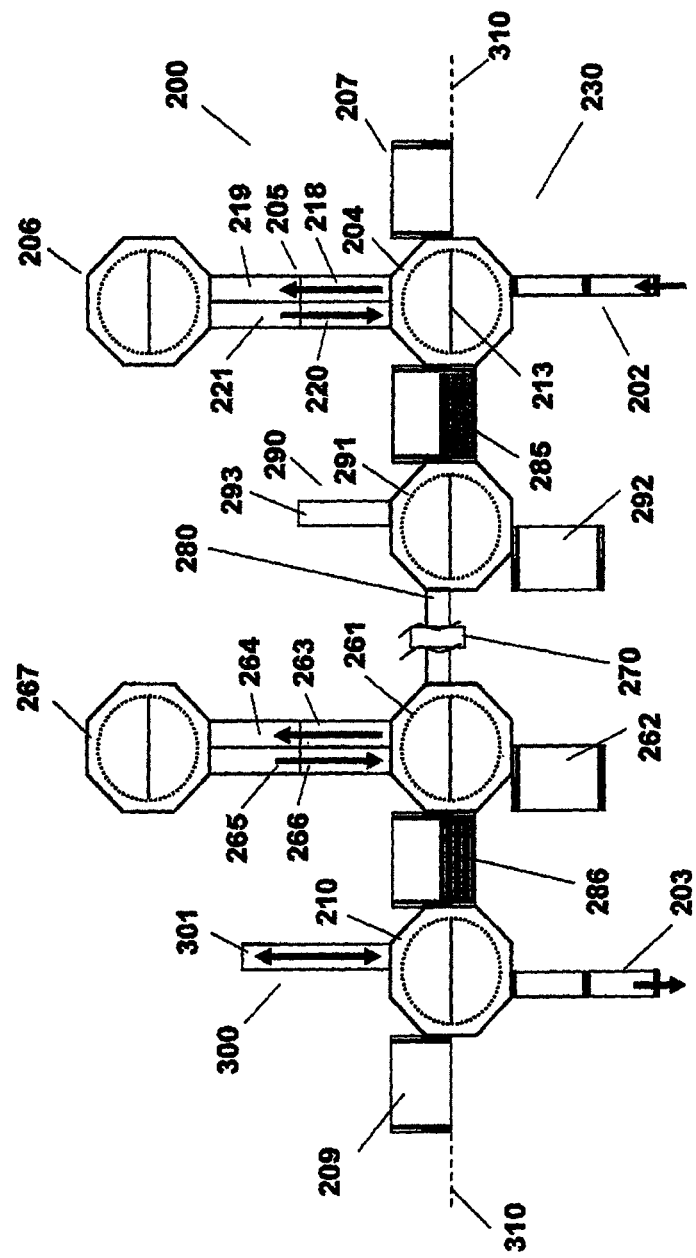
Figure 4:
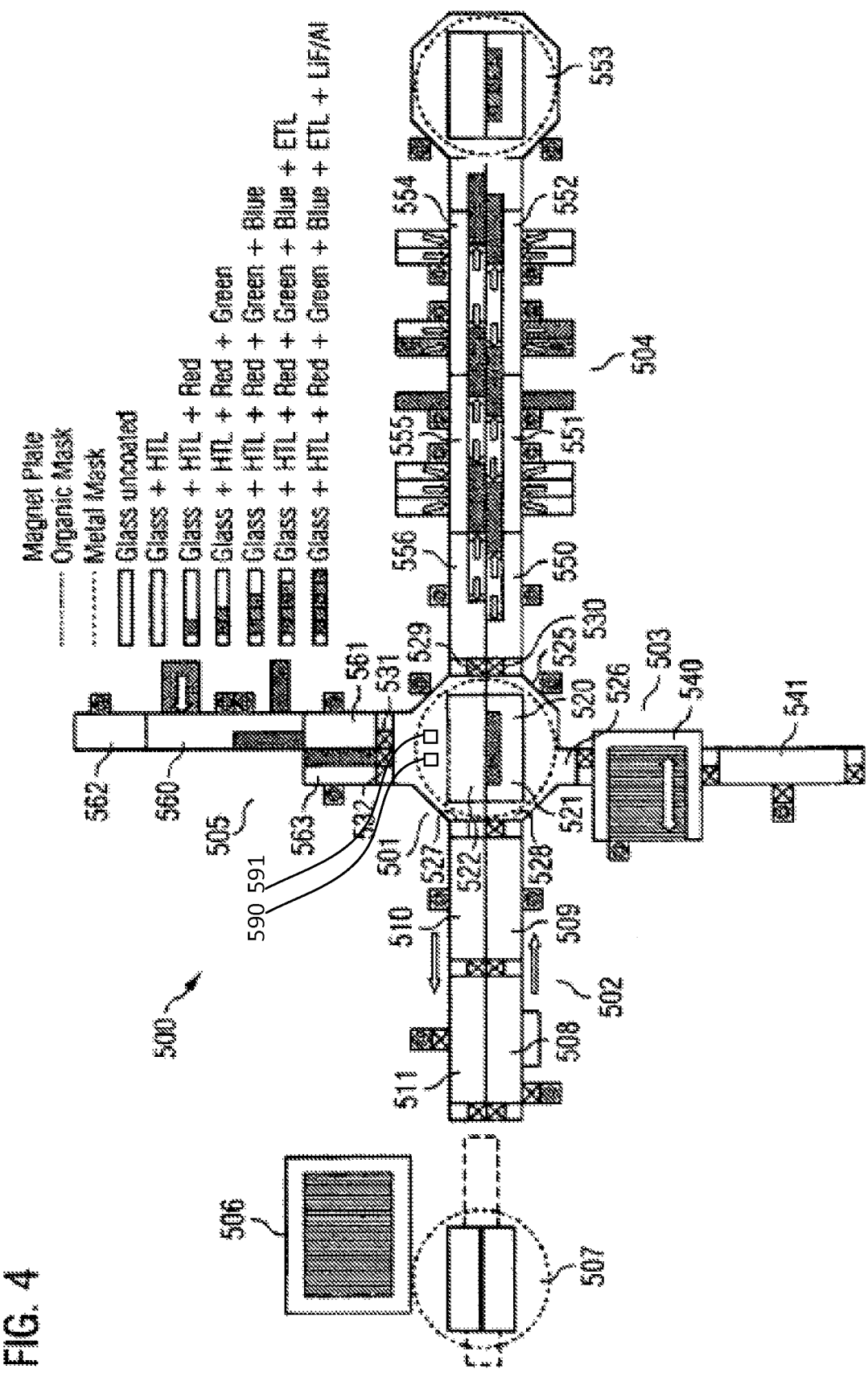
Figure 5:
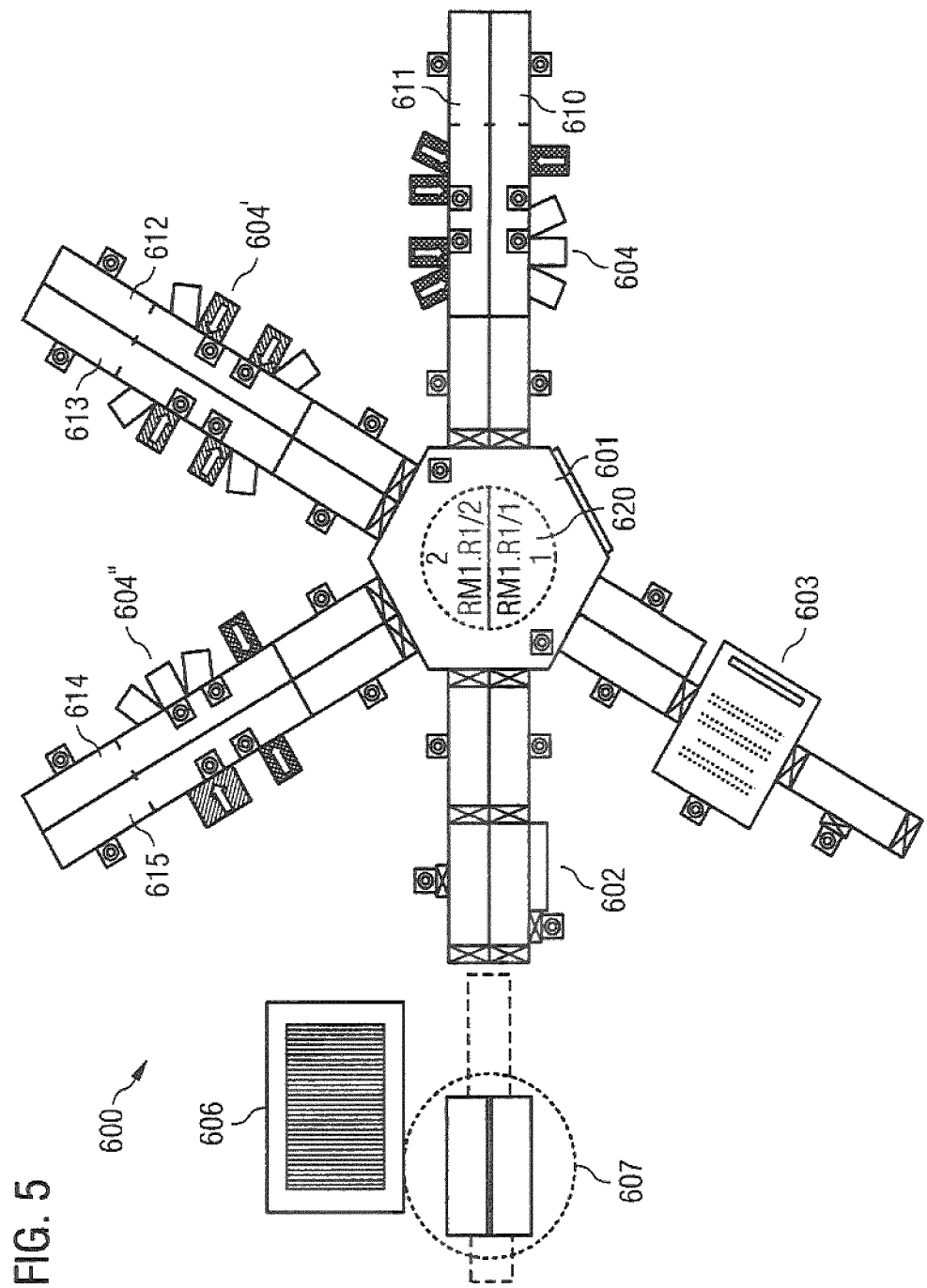
Figure 6:
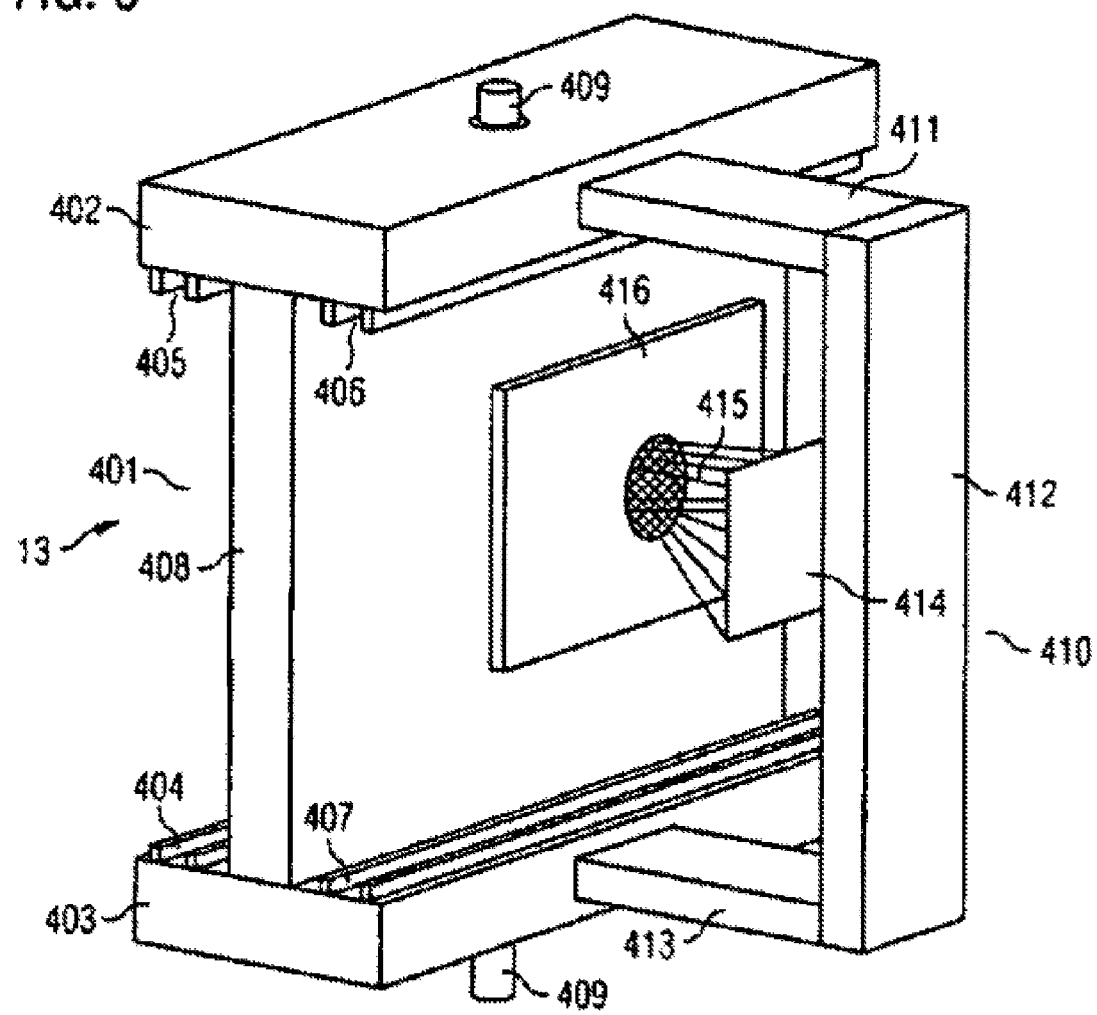

Further advantages, features and characteristics of the present invention will become apparent from the following description of preferred embodiments according to the attached drawings. The drawings show in purely schematic form in FIG. 1 a view of a first coating apparatus according to the present invention;

FIG. 2 a view of a second coating apparatus according to the present invention;

FIG. 3 a view of a third embodiment of a coating apparatus according to the present invention;

FIG. 4 a view of a fourth coating apparatus according to the present invention;

FIG. 5 a view of a fifth coating apparatus according to the present invention; and in FIG. 6 a perspective view of a movable support of a rotation module.

EMBODIMENTS

FIG. 1 shows a first example of an inventive coating apparatus for depositing two layers on a substrate. For carrying out the corresponding processes, the coating apparatus 1 comprises a loading path 2 with a lock chamber 14 and a transport chamber 15. The lock chamber 14 allows bringing the substrate to be coated from atmosphere to high vacuum conditions set in the coating apparatus. Accordingly, the lock chamber 14 comprises two locks 16 and 17 at the outlet or inlet, respectively, of the lock chamber. When a new substrate is introduced into the lock chamber 14, the lock 16 is closed and the lock 17 is opened so as to allow introducing the substrate. When the substrate is located in the lock chamber 14, the lock 17 is closed and the lock chamber 14 is evacuated to the vacuum conditions set in the coating apparatus. When these vacuum conditions are achieved, the lock 16 is opened so as to allow the substrate to be moved to the transport chamber 15. Alternatively, the lock chamber 14 may be disposed directly at the following rotation module 4. However, interposing the transport chamber 15 enables to separate lock-in processes from the further movement of the substrate through the rotation type handling module 4, in the following also designated as rotation module.

When the substrate located in transport chamber 15 is ready to move into the rotation module 4, the movable support 13 is rotated such that a retainer on the substrate is aligned with the movement direction of the loading path 2. Accordingly, the substrate or the substrate carrier on which the substrate is located can be moved by a linear motion towards the movable support so that the substrate or the substrate carrier with the substrate can be placed on the retainer of the movable support 13. Since the mask magazine 7 is attached to the rotation module 4 at the side opposite to the side of the loading path 2, at the same time a mask can be moved from the mask magazine 7 into the rotation module 4 so that the arranging and alignment device disposed in the rotation module 4 or at the movable support, respectively, can place the mask onto the substrate. After finishing the mask alignment, the substrate is ready for the first coating process.

Since the first coating path 5 is attached to the rotation module 4 at a side being rotated by 90° with respect to the sides where the mask magazine 7 as well as the loading path 2 are located, the movable support 13 is rotated around the rotation axis located in the centre of the rotation module 4 so that the retainer of the movable support 13 is aligned such with the first coating path 5 so as to allow the substrate or the substrate carrier, respectively, to be moved into the first coating path 5 (deposition area).

The first coating path 5 comprises several compartments 18 to 21 being placed in pairs of two back-to-back in twin-compartment chambers which define the coating path. Due to the twin-compartment construction of the coating chambers 18, 20 and 19, 21 a very space saving design of the coating apparatus 1 is possible. According to the example shown in FIG. 1, the substrate is moved according to the arrow shown in compartment 18 of the twin-compartment chamber 18, 20 in the first compartments 18 to 19 of the chambers rightwards and thereafter leftwards in the second compartments 20, 21 of the chambers. For carrying out the U-turn necessary for the substrate to be moved first in the compartments 18 and 19 in the first direction and afterwards in the compartments 21 and 20 in the opposite direction, a second type of a rotation module called rotation unit 6 is provided for. The rotation unit 6 is able to rotate the substrate or the substrate carrier by 180°. However, the rotation unit 6 does not comprise any additional devices like mask arranging or mask aligning devices or suchlike.

During movement in the twin-structure chambers or compartments 18 to 21, the substrate is continuously coated by corresponding coating processes like sputter processes, chemical vapor deposition, physical vapor deposition and the like. The devices necessary for carrying out the coating processes as well as pre-treatment and/or after-treatment processes are not shown in FIG. 1. However, all kind of processes as mentioned before can be carried out in the vacuum compartments arranged along the first coating path 5. Accordingly, the number of compartments may differ from that shown in FIG. 1.

As mentioned before, the substrate can be equipped with a mask during the coating process, as this is normally the case for the layers deposited for producing organic light emitting diode OLED-structures. However, if no mask is necessary for the coating process, the coating path 5 can also be used for a maskless deposition of a layer.

When a mask is used during the coating process in the first coating path 5, the mask can be removed from the substrate in the rotation module 4 before leaving the rotation module 4 towards the second coating path 11. For the purpose of mask removing, the movable support 13 is again rotated by 90° degree after receiving the substrate or substrate carrier from compartment 20 in order to align the movable support 13 with the mask magazine 7 and to allow the mask arranging device to remove the mask from the substrate and to transport the mask into the mask magazine 7 by linear movement from the movable support 13 to the mask magazine. Accordingly, the movable support 13 is oriented perpendicular to the position shown in FIG. 1.

After removing of the mask, the movable support is again rotated by 90° to be aligned with the moving direction of the transport chamber 8 connected to the rotation module 4 opposite to the first coating path 5 and the substrate or substrate carrier, respectively, is moved through the transport chamber 8 into a second rotation module 10 being identical or mirror symmetrical to the rotation module 4. Accordingly, as shown for the rotation module 4, the rotation module 10 also comprises a movable support which can be rotated in at least two positions in which the retainer of the movable support can be loaded with a substrate from the transport chamber 8, a mask from the mask magazine 9 or a coated substrate from the compartment 25 of a second coating path 11. In addition, the movable support of the second rotation module can also be positioned such that the substrate can leave the rotation module 10 into the compartment 22 or the unloading path 3. Accordingly, at least two positions, namely positions rotated 90° to each other are possible for the movable support as shown for the first rotation module 4. Preferably, the movable or rotatable support may adopt four positions each rotated 90°. If the movable support comprises two retainers disposed back-to-back with the rotation axis in between as described below with respect to FIG. 6, four positions of the movable support are advantageous, since each side of the movable support comprising a retainer can be positioned with respect to the left and right part of a side wall of the rotation module, for example the side walls of the rotation module where the mask magazine 9 or the second coating path 11 are connected to the rotation module 10. This also applies to the rotation module 4. In addition, the movable or rotatable support may be positioned in a different number of positions, e.g. three position or more than four positions, depending on the design of the chamber of the rotation module and the devices connected to the rotation module.

The unloading path 3 connected to the rotation module is identical to the loading path 2 with the only difference that the movement direction is opposite to that of the loading path 2. Moreover, the locking process is also vice versa.

The coating apparatus 1 shown in FIG. 1 comprises two independent parts, namely a coating section 30 and a coating section 40 which are connected by the transport chamber 8. This design allows for independent coating processes with a very space and resources saving construction.

FIG. 2 shows an example of a further inventive coating apparatus 100 which comprises identical components already described with respect to FIG. 1. Accordingly, such components which have the same reference number added by 100 are not described again. With respect to these reference numbers it is referred to the description of FIG. 1.

Accordingly, the embodiment of FIG. 2 differs with respect to the embodiment of FIG. 1 only with respect to the number of coating sections and the arrangement of these sections within the coating apparatus 100. As can be seen from FIG. 2, the right coating section 130 and the left coating section 140 are almost identical to the coating sections 30 and 40 of the embodiment shown in FIG. 1. The coating section 140 is only adapted for depositing a top layer instead of a second coating so that this coating path 111 is designated as top-layer coating path 111. The reason is that between the coating sections 130 and 140 coating sections 150 and 160 are provided for in the embodiment of FIG. 2. This proves that the concept of the coating apparatus of the present invention is very flexible so that in a simple manner the apparatus 100 can be adapted to the needs of the coating to be produced. If, instead of two layer coating a layer stack comprising n-layers has to be produced, the coating apparatus 100 can be extended as shown in FIG. 2 by arranging the appropriate number of coating sections 160. Accordingly, this is schematically indicated by the separation lines 170 and 171 shown in the transport chambers 180 and 181 connecting the coating sections 150 and 160 as well as the coating section 160 with the coating section 140, respectively. Accordingly, any number of layers in a layer stack can be produced one after the other. Only additional coating sections 160 had to be added to the coating apparatus 100.

A substrate introduced into the coating apparatus 100 at the lock-chamber 114 of the loading path 102 is moved, as described before, to the rotation module 104, provided with a mask from the mask magazine 107 and rotated by the movable support 113 so that it can be moved through compartments 118 and 119 to the rotation unit 106. After making a U-turn in the rotation unit 106 and travelling afterwards through the compartments 120 and 121 back again to the rotation module 104 the mask is again removed in the rotation module 104 and stored in the mask magazine 107. After leaving the rotation module 104, the substrate is transferred through the transport channel 108 to the second coating section 150.

The second coating section 150 comprises the rotation module 151 which is almost identical to the rotation module 130 of the coating section 130. Only the connection of the rotation module 151 to adjacent transport chambers 108 or 180 as well as to coating chambers 153, 156 and 154, 155 or mask magazine 152 is slightly different with respect to the place of connections. Accordingly, mask magazine 152 of the coating section 150 is opposite to the side where the mask magazine 107 is located at the rotation module 104. Opposite to the side where the mask magazine 152 is connected to the rotation module 151, the second layer coating path and the compartments 153 to 156 are disposed. Accordingly, the substrate coming from the transport chamber 108 is disposed at the retainer of the movable support 158 and is rotated by 90° so that a linear movement path of the substrate or the substrate carrier is aligned with the direction towards the mask magazine 152 as well as the second coating path 153 to 157. In this position of the movable support 158 which is perpendicular to the position shown in FIG. 2, a mask from the mask magazine 152 may be arranged at the substrate if the mask is necessary for the following second coating process. After arranging the mask at the substrate in the rotation module 151, the substrate or substrate carrier is moved into the compartment 153 where the coating process for the second layer is starting. During movement of the substrate through the compartments 153 and 154 and the rotation module 157 as well as the compartments 155 and 156 a second layer is deposited at the substrate and all necessary treatments before and after depositing of the layer may be carried out.

After leaving the compartment 156, the substrate is received in the retainer of the movable support 158 and the mask is removed from the substrate by the mask arranging device located in the rotation module 151. The mask can be stored in the mask magazine 152 and can be used for the next substrate to be coated in the coating section 150. If necessary, a mask cleaning device may be arranged at the mask magazine 152, so that the mask can be cleaned if necessary, before re-using it for the next deposition process.

After removing of the mask, the movable support 158 is again rotated by 90° so that the substrate coated with a second layer can leave the rotation module 151 into the transport chamber 180.

As mentioned before, a lot of coating sections 150, 160 may be arranged one after the other in the coating apparatus 100 depending on the number of layers which have to be deposited. Due to the design of the apparatus 100, it is also possible to only move the substrate through the rotation module 151, 161 to the next coating section, if for specific substrates or generally for the process being carried out in the coating apparatus 100, a third or fourth layer has not to be deposited. Therefore, the coating apparatus 100 is also very flexible with respect to the kind of use of the apparatus 100.

The coating section 160 is identical to the coating section 150. The only difference is the location of the inlet of the transport chamber 180 in the rotation module 161 compared to the inlet of the transport chamber 108 in the rotation module 151. In order to save additional movements of the movable support, the place of connection to adjacent transport chambers at the different rotation modules may vary from one coating section to the other.

Since coating section 160 and 150 are almost identical, it is abstained from describing the same components having the same reference numerals added by 10.

The last coating section 140 in the series of coating sections 130, 150, 160 of the coating apparatus 100 is identical to the second coating section 40 of the embodiment shown in FIG. 1, so that again with respect to the description of these components it is referred to the description of the embodiment of FIG. 1. Again, the same components have the same reference numerals added by 100.

The different coating sections 130, 150, 160 as well as 140 can be operated independently so that e.g. the velocity of the substrate at which the substrate is moving through the coating path can be set optimally according to the requirements of the coating process. Only the rotation modules 104, 151, 161 and 110 have to be adapted to each other so as to allow a continuous flow of the substrates through the coating apparatus 100. Thus, more flexibility with respect to optimization of each single coating process as well as an optimization of the through-put through the coating apparatus 100 is possible.

FIG. 3 shows a third coating apparatus 200 similar to that one shown in FIG. 2. Accordingly, the same reference numerals added by 100 are used for designating the identical components of the embodiment shown in FIG. 3. An additional description is omitted.

The differences between the coating apparatus 100 and the coating apparatus 200 are explained as follows.

The coating apparatus 200 comprises a first coating section 230, wherein the location of the mask magazine 207 and the first coating path 205 are exchanged. In the embodiment of FIG. 3, the first coating path 205 is located opposite to the loading path 202 while the mask magazine 207 is located along the straight travel line of the substrate or the substrate carriers through the rotation modules 204, 291, 261 and 210 of the different coating sections 230, 290, 260 and 300 indicated by the broken line 310. Accordingly, the sequence of movements of the movable support 213 has to be adapted for receiving and removing the substrate as well as arranging and removing a mask.

A further difference between the coating apparatus 200 and the coating apparatus 100 is given with respect to the second coating section 290. Instead of a continuous coating a static coating is carried out. Accordingly, only one coating chamber 293 of a single-type coating chamber is disposed in coating section 290.

Still another difference between the embodiment of FIG. 3 and that one of FIG. 2 is the connection between the coating sections 230 and 290 or 260 and 300. While in FIG. 2 transport chambers 108, 180, 181 are used for connecting the coating sections 130, 150, 160 and 140 buffer chambers 285 and 286 are arranged between rotation modules 204 and 291 as well as 261 and 210. Buffer chambers 285, 286 are designed such so as to allow storing of substrates or substrate carriers with substrates. Accordingly, it is possible to run the different coating sections more flexible and more independently from each other. Thus, it is possible to finish a coating process in a coating section, although a subsequent coating section is out of order.

Similar to the coating section 290 the coating section 300 is not equipped for a continuous coating, but for a wobble deposition of a layer. During wobble deposition the substrate is linearly moved back and forth to achieve homogeneity of the coating. Accordingly, the coating chamber 301 comprises a device for reciprocating motion of the substrate or substrate carrier.

Even though different coating sections have been described with respect to the embodiments of FIG. 1 to 3, it is evident for a man skilled in the art that other coating processes or even other treatments may be performed in such sections and that accordingly the design of such sections may be different. Thus, although the coating sections refer by name only to coating processes, other processes like pre-treatment, after-treatment or finishing treatment processes may be carried out in these sections and the sections may be equipped accordingly.

Another type of a coating apparatus is shown in FIG. 4. The coating apparatus 500 comprises only a single central rotation type handling module 501. Around the central rotation type handling module 501 a loading and unloading section 502, a central mask storage unit 503, a first deposition area 504 and a second deposition area 505 are located.

In front of the loading and unloading section 502 a substrate carrier storage 506 and a substrate handling unit 507 for placing the substrates on the substrate carriers of the substrate carrier storage 506 and for transporting the substrates together with a substrate carrier to the loading and unloading section 502 is provided. The loading and unloading section 502 comprises two twin-type vacuum chambers having the compartments 508, 509, 510 and 511.

The compartments 508 and 511 are designed as lock-chambers, identical to the lock-chamber 14 of the embodiment of FIG. 1. Accordingly, it is referred to the description of the embodiment of FIG. 1. In addition, the loading and unloading section 502 comprises in the compartments 509 and 510 transport chambers like the transport chamber 15 of the embodiment of FIG. 1.

The loading and unloading section 502 is connected to the vacuum chamber 525 of the rotation type handling module 501 and openings 527 and 528 are provided for in the compartments 509 and 510 as well as the chamber wall 525 of the rotation type handling module 501 to allow exchange of the substrates or the substrates together with the substrate carriers.

In the middle of the rotation module 501 a movable support 520 comprising a retainer 520 is arranged. The movable support may be designed similar to the embodiment of the movable support described in FIG. 6 and rotates around the central axis of the rotation type handling module 501.

The movable support 520 can be rotated around the central rotation axis so that the retainers 521 and 522 can be aligned with different openings 526 to 532 of the vacuum chamber of the rotation module 501.

The loading and unloading section 502 may be designed such that the compartments 508 and 509 are only used for loading substrates while the compartments 510 and 511 are only used for unloading the substrates. However, in another embodiment the compartments 508 to 511 may be quipped in such a way that the substrates may be moved in both directions along the transport path so that the compartments 508 and 509 may not only be used for loading substrates but also for unloading them. The same applies for the compartments 510 and 511.

After loading the substrate located on the substrate carrier through the compartments 508 and 509 into the coating apparatus on the retainer 521 the movable support 520 may be rotated by 90° so that the retainers 521 and 522 are aligned with the openings 526, 531 and 532 of the vacuum chamber 525. Accordingly, the retainer 521 may receive a mask from the central mask storage unit 503 through the opening 526. After arrangement and alignment of the mask onto the substrate, the movable support 522 may again be rotated by 90° so that retainer 521 comprising the substrate with the attached mask is aligned to the opening 530 which is connecting the rotation type handling module 501 with the deposition area 504.

The deposition area 504 comprises a continuous deposition path for continuously depositing several layers onto the substrate. The deposition area 504 comprises several twin type coating chambers comprising the compartments 550, 551, 552, 554, 555 and 556. In the different compartments 550 to 552 and 554 to 556 of the deposition area 504 different treatments of the surface of the substrate may be carried out during continuous movement of the substrate through the compartments. For example, the compartments 550, 551, 552 may be equipped for the deposition of the hole transport layer as well as red and green organic light emitting layers. Similarly, the compartments 554 and 556 comprise equipment for depositing an organic blue light emitting layer as well as an electron transport layer. Accordingly, the substrates are moved through the compartments 550, 551, 552, 554, 555 and 556 in this order to receive the layers in the same order. Between the compartments 552 and 554 a rotation unit 553 for turning the substrate by 180° is provided. However, this rotation unit 553 does not comprise any tools for mask arrangement and/or alignment.

After leaving the compartment 556 the substrate is again received by the movable support 520 and the mask is removed from the substrate by the mask arranging 590 and aligning devices 591 (shown as block representations of the devices) provided in the rotation module 501. The mask is again stored in the central mask storage unit 503 while the next mask for a subsequent deposition process in the deposition area 505 is arranged at the substrate. For attaching and removing the appropriate masks, the substrate is rotated by the movable support 520 to the appropriate positions. After attaching of a mask for the deposition process carried out in the deposition area 505 the substrate together with the mask is moved into the deposition area 505. This deposition area 505 is according to the embodiment of FIG. 4 equipped with devices for LiF-treatment and aluminium deposition.

For this purpose the deposition area 505 comprises twin-type vacuum chambers comprising the compartments 561 and 563 as well as a single-type vacuum chamber 562. While the LiF-treatment and the aluminium deposition are carried out in the vacuum chamber 560, the vacuum chamber 562 is provided for change of the movement direction of the substrate without simultaneous deposition of a layer which might lead to an inhomogeneous layer. The transport compartment 561 is arranged for storing the substrate in order to wait until the rotation module 501 is ready for taking over the substrate. In addition, the compartment 563 also provides space for storing a substrate, if this is necessary in the processing sequence.

After the deposition of the layer in the deposition area 505 the mask is removed in the rotation module 501 and the finally coated substrate is unloaded through the loading and unloading section 502.

The coating apparatus 500 is especially suitable for the deposition of organic light emitting diodes (OLED) for lighting devices, since for this purpose no different masks have to be used for depositing the red, green or blue layers of the OLED-structure. Accordingly, one continuous coating process can be formed in the deposition area 504.

As indicated, the two coating paths provided for in the twin-type coating chambers of the deposition area 504 may be also used as a back-and-forth movement path so that the rotation unit 553 can be omitted. However, the order of the coating devices has to be adapted. If the deposition area 504 is used with two parallel back-and-forth deposition paths, the substrate is moved from the rotation module 501 through the compartments 550, 551 and 552 and again back from 552 through 551 to 550. After rotation of the substrate in the rotation module 501 the substrate may be moved through the compartments 556, 555 and 554 and back again through 555 to 556.

The back-and-forth continuous deposition similar to that described with respect to deposition area 504 is used in the embodiment of coating apparatus 600 shown in FIG. 5.

The embodiment of FIG. 5 also comprises only a single rotation type handling module 601 which is connected to a loading and unloading section 602 and a central mask storage unit 603. These components as well as the substrate carrier storage 606 and the substrate handling unit 607 are identical to corresponding components of the coating apparatus 500 so that for the sake of simplicity a repeated description of these components is omitted. Instead of the deposition areas 504 and 505, deposition areas 604, 604' and 604" are provided for. All these deposition areas 604, 604', 604" are designed as back-and-forth continuous coating paths being arranged parallel to each other in pairs of two in twin-type coating chambers. In all these deposition areas 604, 604', 604" the substrate is moving in a linear movement from the rotation type handling module 601 to the end of the movement path in the deposition area and back on the same movement path in the opposite direction. Thus, the substrate is passing the deposition devices twice. In the deposition area 604 and the first back-and-forth continuous path 610 the hole transportation layer is deposited while in the parallel deposition path 611 the red emitting layer is deposited. Accordingly, the deposition area 604' comprises the third deposition path 612 for the green light emitting layer and the fourth deposition path 613 for the blue light emitting layer. Finally, the deposition area 604' comprises the sixth deposition path 614 for depositing of the electron transport layer and the seventh deposition path 615 for depositing the aluminium layer. Accordingly, the substrate is received by the movable support 620 of the rotation type handling module after every deposition step in each deposition path 610 to 615 in order to exchange the masks which are delivered and stored in the central mask storage unit 603. Accordingly, this coating apparatus 600 may be used for producing OLED-displays for which for each layer different masks have to be applied.

FIG. 6 shows an example for a movable support 13 as used in the rotation modules 4, 10, 104, 110, 151, 161, 204, 210, 261, 291, 501 and 601. The movable support 13 comprises a frame 401 having a central plate structure 408 at the ends of which end plates 402 and 403 are disposed so as to form a double T structure in a cross section in a vertical direction. Parallel to the central plate structure two retainers are provided for. The retainers comprise guide and support elements in form of rails 404, 405 and 406, 407 arranged at opposing sides of the end plates 402, 403. The substrate or a substrate carrier can be pushed into the rails 404, 405 or 406, 407 along a movement direction parallel to a main surface of the central plate structure 408. Thus, the substrate or substrate carrier can be arranged at the movable support by a linear movement.

In order to align the movable substrate with adjacent components like transport chambers, coating chambers and buffer chambers as described above, a rotation axis 409 extending through the center of the frame 401 and especially through the central plate structure is provided for. Thus, a substrate held by a retainer 404, 405 or 406, 407 in vertical or almost vertical alignment with a angle deviation of ±40°, especially ±20° to the vertical direction can be rotated around the vertical axis 409.

Opposing the main surfaces of the central plate structure 408 an U-bend arch bracket 410 for mounting an arranging and alignment device for a mask is disposed. The U-bend arch bracket comprises two horizontally aligned rods 411 and 413 attached to the upper end plate 402 as well as the lower end plate 403 and a vertically aligned rod 412 connecting the ends of the rods 411 and 413 being distal to the end plates 402 and 403. Thus, a handling and receiving space for the substrate as well as the masks used for deposition is defined.

At a mounting plate 414 fixed to the U-bend arch bracket 410 an arranging and alignment device 415 in form of a six axes parallel kinematic is mounted. The six axes parallel kinematic 415 comprises six independently actuated legs which connect the mounting plate 414 with a receiver platform for the mask. The lengths of the legs can be changed and due to gimbal mounting of the legs to the platform and to the mounting plate, the position and orientation of the platform can be varied so that a mask contained in the receiver platform 416 can be aligned with respect to a substrate positioned in a retainer of the movable support 13.

Instead of a six axes parallel kinematic any other suitable device for arranging and removing of a mask on a substrate as well as aligning of the mask relative to the substrate may be used.

Although the present invention is described in detail with respect to the embodiments disclosed above, it is evident for a man skilled in the art that the invention is not restricted to these embodiments, but amendments like different combinations of features described with respect to the embodiments or omitting of features are possible without leaving the scope of the present invention which is defined according to the attached claims. In particular, the invention comprises all possible combinations of single features disclosed in this specification.

What is claimed is:

1. Handling module for a coating apparatus comprising
a movable support for orientating a substrate, the movable support being movable between at least a first position and a second position, wherein in the first position the substrate is oriented parallel to a plane, and in the second position the substrate is oriented perpendicular to the plane, and wherein the movable support comprises:
  a mask arranging device for:
    receiving a mask at the movable support when the movable support is in the first position; and
    attaching and detaching the mask from the substrate; and
  a mask alignment device by which the mask is aligned with respect to the substrate;
  wherein the mask alignment device and the mask arranging device are attached to the movable support so as to move together with the movable support, and wherein the substrate is movable to and from the movable support at least when the movable support is in the second position,
  wherein the movable support comprises a number of retainers for the substrate, the number of retainers being chosen from the group consisting of two, three, four and any integer number of retainers, wherein the retainers are arranged at sides of the movable support being parallel to a rotation axis of the movable support, with the number of sides being equal to the number of retainers and especially at least two retainers or pairs of retainers are arranged opposite and back-to-back to each other.

2. Handling module according to claim 1, wherein the handling module comprises a vacuum chamber and the movable support comprises at least one retainer for the substrate and the mask arranging device is located within the vacuum chamber of the handling module opposite to the at least one retainer for the substrate at at least one of the at least two positions of the movable support.

3. Handling module according to claim 1, wherein the movable support is rotatable around a rotation axis.

4. Handling module according to claim 1, wherein the movable support for the substrate is designed such that a retainer of the movable support is directly in contact with at least one of the substrate and a substrate carrier for the substrate.

5. Handling module according to claim 1, wherein the movable support for a substrate is designed such that the substrate is carried in an upright position with a plane parallel to a main surface of the substrate being within an angle area of ±40° to a vertical direction.

6. Handling module according to claim 1, wherein a rotation axis of the movable support is aligned within an angle area of ±10° to a vertical direction.

7. Handling module according to claim 1, wherein a six axes parallel kinematic is provided for at least one of arranging and aligning the mask to the substrate.

8. Handling module according to claim 1, wherein the handling module comprises a housing having at least three openings.

9. Handling module according to claim 1, wherein the at least two positions of the movable support are rotated by at least one of the group consisting of 30°, 45°, 60°, 90° and multiples thereof.

10. Handling module according to claim 8, wherein the at least two positions of the movable support are aligned to the openings of the housing of the handling module, at least two openings being usable at at least one of the positions of the movable support.

11. Handling module for a coating apparatus comprising
a movable support for orientating a substrate, the movable support being movable between at least a first position and a second position, wherein in the first position the substrate is oriented parallel to a plane, and in the second position the substrate is oriented perpendicular to the plane, and wherein the movable support comprises:
a mask arranging device for:
receiving a mask at the movable support when the movable support is in the first position; and
attaching and detaching the mask from the substrate; and
a mask alignment device by which the mask is aligned with respect to the substrate;
wherein the mask alignment device and the mask arranging device are attached to the movable support so as to move together with the movable support, and wherein the substrate is movable to and from the movable support at least when the movable support is in the second position,
wherein the movable support comprises a frame of a form selected of a group consisting of: a plate- and cuboid- and prism- like form with a rotation axis extending parallel to the longitudinal axis of the frame and at least two substrate retainers disposed at the frame, the frame further having at least one of the mask arranging device and the mask alignment device being disposed opposite to at least one of the substrate retainers at a U-bent construction extending from a top area of the frame to a bottom area of the frame defining a space between at least one substrate retainer and U-bent construction for receiving and manipulating the substrate and the mask.

12. Handling module according to claim 11, wherein at least one of the mask arranging device and the mask alignment device is disposed opposite to each substrate retainer.

* * * * *